United States Patent
Den Boef

(10) Patent No.: US 8,823,922 B2
(45) Date of Patent: Sep. 2, 2014

(54) OVERLAY MEASUREMENT APPARATUS, LITHOGRAPHIC APPARATUS AND DEVICE MANUFACTURING METHOD USING SUCH OVERLAY MEASUREMENT APPARATUS

(75) Inventor: Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 899 days.

(21) Appl. No.: 13/000,229

(22) PCT Filed: May 14, 2009

(86) PCT No.: PCT/EP2009/055809
§ 371 (c)(1),
(2), (4) Date: Apr. 18, 2011

(87) PCT Pub. No.: WO2009/156225
PCT Pub. Date: Dec. 30, 2009

(65) Prior Publication Data
US 2011/0188020 A1    Aug. 4, 2011

Related U.S. Application Data

(60) Provisional application No. 61/075,969, filed on Jun. 26, 2008.

(51) Int. Cl.
*G03B 27/72* (2006.01)
*G03B 27/42* (2006.01)
*G03B 27/32* (2006.01)

(52) U.S. Cl.
USPC .................................. 355/71; 355/53; 355/77

(58) Field of Classification Search
CPC . G03F 7/70633; G03G 7/70616; H01L 22/12
USPC ........................................ 355/71, 53; 356/369
See application file for complete search history.

(56) References Cited

U.S. PATENT DOCUMENTS 6,762,111 B2    7/2004  Fukuda
6,897,956 B2    5/2005  Noguchi et al.
(Continued)

FOREIGN PATENT DOCUMENTS

EP    1 628 164 A2    2/2006
EP    1 870 696 A1   12/2007
(Continued)

OTHER PUBLICATIONS

International Search Report directed to related International Patent Application No. PCT/EP2009/055809, mailed Dec. 7, 2009, from the European Patent Office; 2 pages.

(Continued)

*Primary Examiner* — Peter B Kim
(74) *Attorney, Agent, or Firm* — Sterne, Kessler, Goldstein & Fox, P.L.L.C.

(57) ABSTRACT

An overlay measurement apparatus has a polarized light source for illuminating a sample with a polarized light beam and an optical system to capture light that is scattered by the sample. The optical system includes a polarizer for transmitting an orthogonal polarization component that is orthogonal to a polarization direction of the polarized light beam. A detector measures intensity of the orthogonal polarization component. A processing unit is connected to the detector, and is arranged to process the orthogonal polarization component for overlay metrology measurement using asymmetry data derived from the orthogonal polarization component.

16 Claims, 5 Drawing Sheets

(56) References Cited

U.S. PATENT DOCUMENTS

| | | |
|---|---|---|
| 6,992,764 B1 | 1/2006 | Yang et al. |
| 7,573,584 B2 | 8/2009 | Den Boef et al. |
| 7,692,792 B2 | 4/2010 | Kiers et al. |
| 8,553,230 B2 * | 10/2013 | Den Boef et al. ............ 356/453 |
| 2003/0206298 A1 | 11/2003 | Bischoff et al. |
| 2006/0221316 A1 | 10/2006 | Yamamoto |
| 2008/0036984 A1 | 2/2008 | Mos et al. |

FOREIGN PATENT DOCUMENTS

| | | |
|---|---|---|
| JP | 2003-224057 A | 8/2003 |
| JP | 2003-247807 A | 9/2003 |
| JP | 2008-042177 A | 2/2008 |
| JP | 2008-042200 A | 2/2008 |
| KR | 10-2008-0027748 A | 3/2008 |
| TW | 200612212 A | 4/2006 |
| TW | 200700926 A | 1/2007 |
| TW | 200710591 A | 3/2007 |
| TW | 200807180 A | 2/2008 |

OTHER PUBLICATIONS

International Preliminary Report on Patentability and Written Opinion directed to related International application No. PCT/EP2009/055809, mailed on Jan. 13, 2011, The International Bureau of WIPO, Geneva, Switzerland; 9 pages.

English-Language Abstract for Taiwanese Patent Publication No. 200612212 A, published Apr. 16, 2006; 1 page.

English-Language Abstract for Taiwanese Patent Publication No. 200710591 A, published Mar. 16, 2007; 1 page.

* cited by examiner

OVERLAY MEASUREMENT APPARATUS, LITHOGRAPHIC APPARATUS AND DEVICE MANUFACTURING METHOD USING SUCH OVERLAY MEASUREMENT APPARATUS

CROSS-REFERENCE TO RELATED APPLICATIONS

This application claims the benefit of U.S. provisional application 61/075,969, which was filed on Jun. 26, 2008, and which is incorporated herein in its entirety by reference.

BACKGROUND

1. Field of the Invention

The present invention relates to an overlay measurement apparatus and a lithographic apparatus and a method for manufacturing a device using such an overlay measurement apparatus.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In known angle-resolved scatterometry systems, overlay is measured as an intensity difference between the +1 and −1 diffraction orders of light reflected from a grating on the substrate. This requires relatively coarse gratings with a pitch of the order of about 300-1000 nm.

SUMMARY

It is desirable to obtain a lithographic apparatus and device manufacturing method in which overlay measurement can be obtained as closely as possible at resolution level. In one example, for overlay at resolution the $0^{th}$ diffraction order is available. For conical diffraction, the $0^{th}$ order also exhibits asymmetry which can theoretically be used for OV metrology. This asymmetry, however, may be extremely small (even at UV wavelengths), which may make the measurement susceptible to sensor asymmetries.

In an embodiment of the present invention, there is provided an overlay measurement apparatus including a polarized light source for illuminating a sample with a polarized light beam, an optical system to capture light that is scattered by the sample, the optical system comprising a polarizer for transmitting an orthogonal polarization component that is orthogonal to a polarization direction of the polarized light beam, and a detector that measures the intensity of the orthogonal polarization component, wherein the overlay measurement apparatus further comprises a processing unit connected to the detector, the processing unit being arranged to only process the orthogonal polarization component for overlay metrology measurement using asymmetry data derived from the orthogonal polarization component.

In another embodiment of the present invention, there is provided a lithographic apparatus comprising such an overlay measurement apparatus.

In a further embodiment of the present invention, a device manufacturing method comprises projecting a patterned beam of radiation onto a substrate, wherein the method comprises illuminating a sample with a polarized light beam, capturing light that is scattered by the sample, transmitting an orthogonal polarization component that is orthogonal to a polarization direction of the polarized light beam, measuring the intensity of the orthogonal polarization component, and processing only the orthogonal polarization component for overlay metrology measurement using asymmetry data derived from the orthogonal polarization component.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

One or more embodiments of the present invention will now be described with reference to the accompanying drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
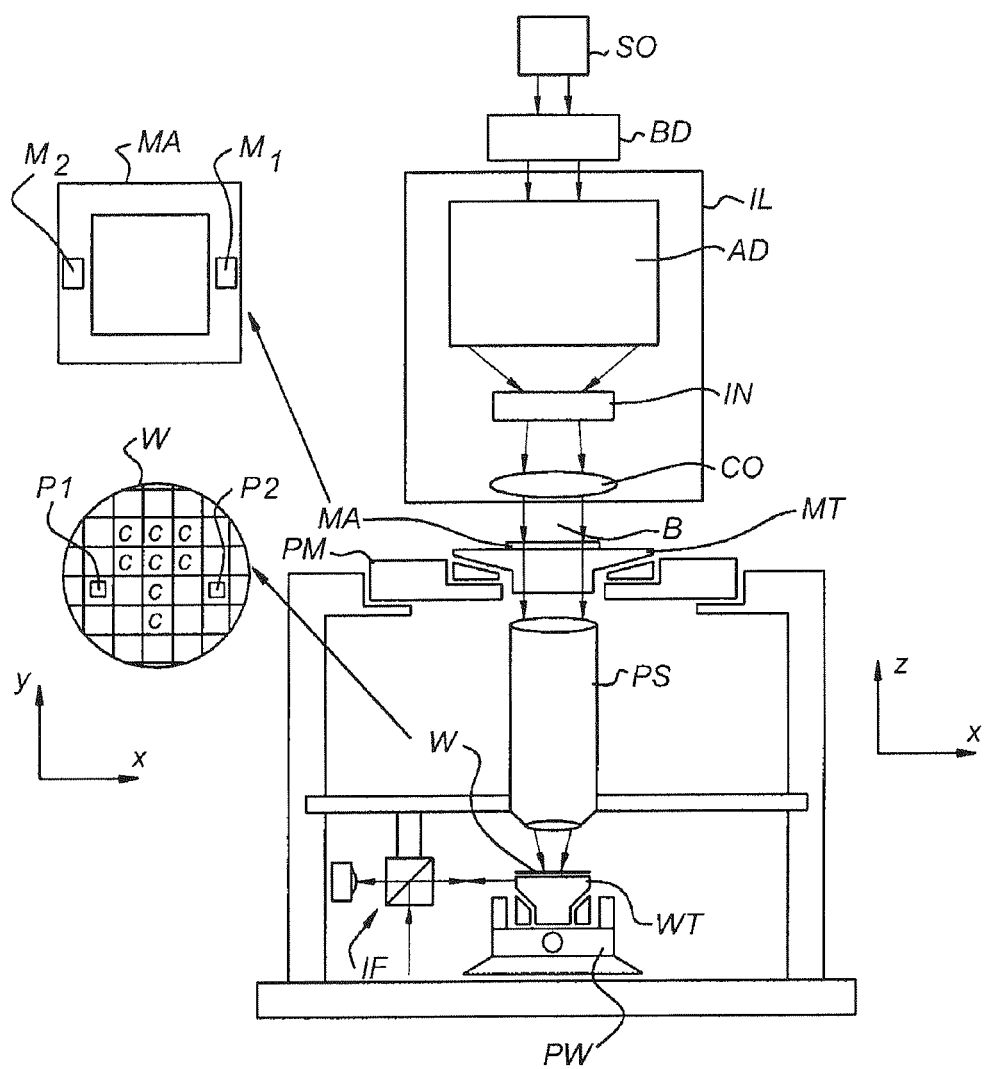
FIG. 1 depicts a lithographic apparatus, according to an embodiment of the invention.

FIG. 1 schematically depicts a lithographic apparatus according to one embodiment of the invention. The apparatus comprises an illumination system, a support structure, a substrate table, and a projection system. The illumination system (illuminator) IL is configured to condition a radiation beam B (e.g., UV radiation or DUV radiation). The support structure (e.g., a mask table) MT is constructed to support a patterning device (e.g., a mask) MA and connected to a first positioner PM configured to accurately position the patterning device in accordance with certain parameters. The substrate table (e.g., a wafer table) WT is constructed to hold a substrate (e.g., a resist-coated wafer) W and connected to a second positioner PW configured to accurately position the substrate in accordance with certain parameters. The projection system (e.g., a refractive projection lens system) PS is configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable minor array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which faint part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
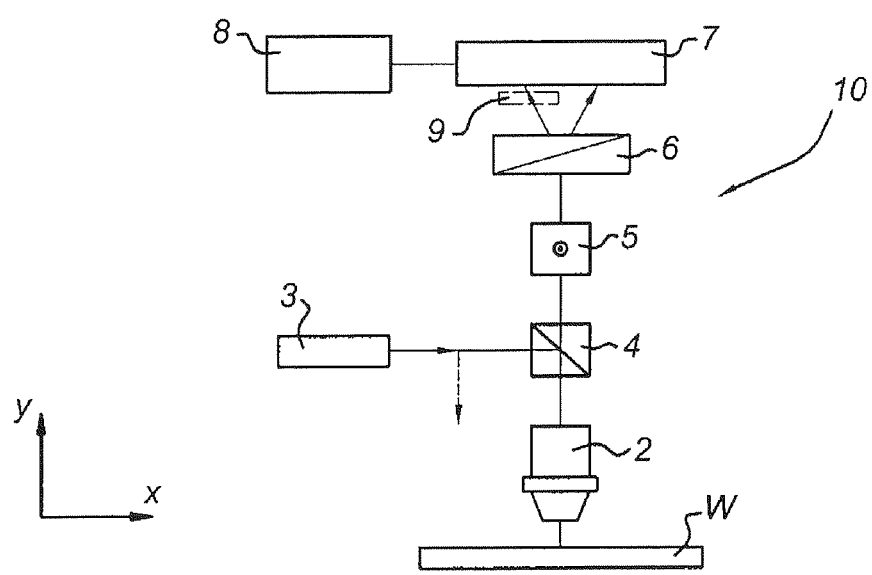
FIG. 2 depicts a schematic view of an overlay measurement system, according to an embodiment of the present invention.

In FIG. 2, a schematic view is shown of an overlay measurement apparatus 10, according to an embodiment of the present invention. A substrate W is provided with a grating or other measurement structure for overlay measurement. This overlay measurement apparatus 10 is advantageously use in a lithographic apparatus, which is arranged to transfer a pattern from a patterning device onto a substrate.

In the example shown, a polarized light source 3 is provided, which produces a light beam of polarized light, e.g., linearly polarized light, for illuminating a sample, e.g., the substrate W. In the schematic view of FIG. 2, an X- and Y-axis are indicated, and the direction of polarization of the light beam is in the Y-direction. The light beam is scattered on the sample, and an optical system captures this scattered light. In the optical system, a polarizer is provided for transmitting an orthogonal polarization component that is orthogonal to a polarization direction of the polarized light beam.

The light beam is directed towards a first non-polarizing beam splitter 4, which directs the light beam towards an objective lens 2 with a high numerical aperture (e.g., more than about 0.9). Objective lens 2 projects a measurement spot on the surface of the substrate W. In this example, the zeroth order diffraction component reflected from the grating on the wafer W is received back in the objective lens 2, after which the first non-polarizing beam splitter 4 transmits the beam of light as a transmitted light beam towards a second non-polarizing beam splitter 5. The beam splitter axes of the first and second non-polarizing beam splitters 4, 5 are mutually perpendicular. For example, in the schematic view of FIG. 2, the axis of the second non-polarizing beam splitter is rotated about 90° around the Y-axis with respect to the axis of the first non-polarizing beam splitter 4. The non-polarizing beam splitters 4, 5 are beam splitters, e.g., with a transmission coefficient T equal to about 0.6 and a reflectivity coefficient R of about 0.3 since these values yield an overall highest efficiency of the light path.

The split light beam originating from the second non-polarizing beam splitter 5 is then directed to a crossed polarizer 6, e.g., in the form of a Wollaston prism. This results in two spatially separated angle-resolved spectra, one in-plane image and one crossed-polarizer image. The crossed polarizer image is detected by a camera 7 (e.g., a CCD or CMOS camera), which measures the intensity of at least the orthogonal polarization component. This data is further processed in a processing unit 8 connected to the camera 7. The camera 7 is arranged in the overlay measurement apparatus in order to image a back focal plane of the objective lens 2 on the sensor of camera 7. This processing unit 8 further processes only the crossed-polarized image (i.e., the orthogonal polarization component) for overlay metrology measurement using asymmetry data derived from the crossed-polarized image intensity measurement.

In a further embodiment, the optical system further comprises an optional blocking element 9 (indicated in dashes in the schematic view of FIG. 2), which blocks the in-plane image from the crossed polarizer 6 to enter the detector 7.

In one example, the scatterometer arrangement in overlay measurement apparatus 10 may be adapted to measure the overlay of two misaligned periodic structures by measuring asymmetry in the reflection spectrum, the asymmetry being related to the extent of the overlay. The scatterometer arrangement is e.g., adapted to measure the overlay of two misaligned gratings or periodic structures by measuring asymmetry in the reflection spectrum and/or the detection configuration, the asymmetry being related to the extent of the overlay. Based on the symmetrical detection configuration, substantially all asymmetries are distinguishable. This provides a straightforward approach to measure misalignment in the gratings.

Overlay metrology is based on the measurement of an asymmetry in the angular scatter spectrum. Symmetric structures yield symmetric angular spectra and an asymmetry in the target shows up as an asymmetry in the angular scatter spectrum. This property is the basis of overlay metrology using angle-resolved scatterometry.

In another embodiment, two overlapping but misaligned gratings comprise bars to form one composite asymmetric target. The resulting asymmetry in the angular scatter spectrum is detected with the overlay measurement apparatus 10 which is used to derive the overlay. This technique is described in more detail in European patent application EP-A-1 628 164, which is incorporated herein by reference in its entirety.

In one example, the present overlay measurement apparatus is suitable for overlay measurements involving a conical diffraction of the light beam on a grating on the substrate W.

The crossed-polarizer image may provide a weak crossed-polarizer spectrum, which is typically 10 to 20 times weaker than the in-plane spectrum. When the crossed polarizer 6 is used, especially when a Wollaston prism is used, a spatially separation of the two spectra can result, and processing of only the crossed-polarizer spectrum can be allowed.

Figure 3:
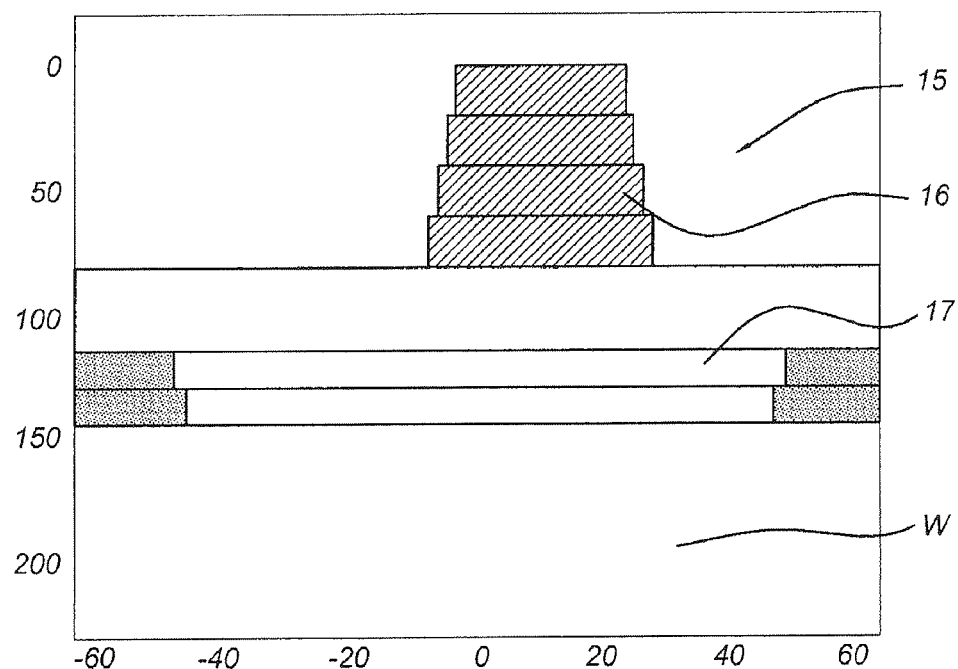
FIG. 3 depicts a cross sectional view of a grating structure on a substrate used in double patterning.

In another embodiment, overlay measurement apparatus 10 has been tested using a so-called double patterning stack 15 on a wafer W having a pitch of about 128 nm, as shown schematically in cross sectional view in FIG. 3. The stack 15 comprises on top of the substrate W a first stack 17 with a hard mask grating of amorphous C, and on top of the first stack 17 a resist grating 16.

Figure 4A:
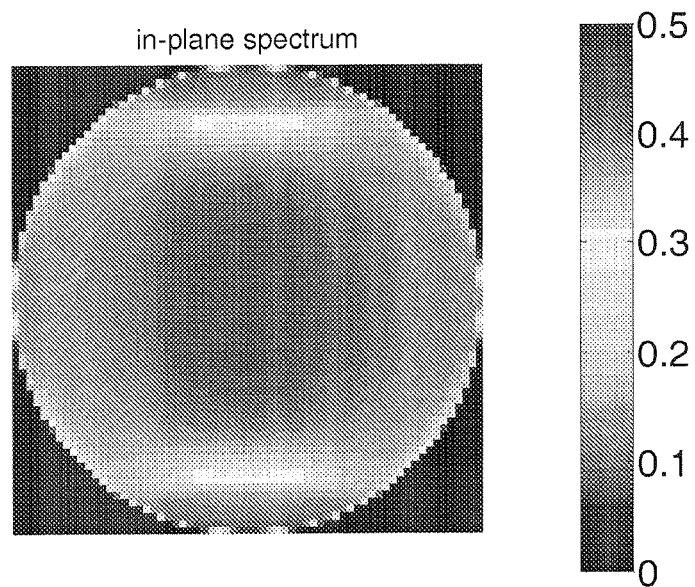
FIGS. 4a and 4b show the in-plane and cross-polarized spectra as measured with the structure of FIG. 3 in the overlay measurement system of FIG. 2.
Figure 4B:
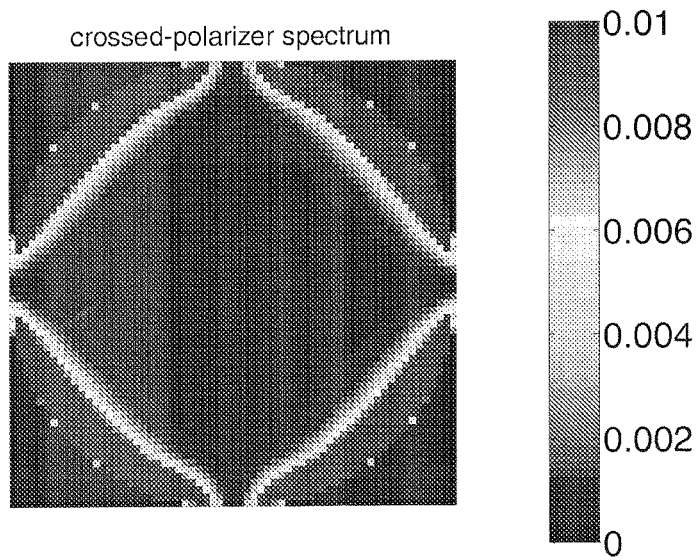

In another embodiment, FIGS. 4a and 4b, the in-plane spectrum (4a) and cross polarizer spectrum (4b) are shown as intensities represented in grayscale. In this example, most of the light is in the in-plane polarized spectrum (about a factor 50 higher than in the crossed-polarizer spectrum). There is only a bit of light in the azimuthal directions of the crossed-polarizer spectrum (4b).

Figure 5:
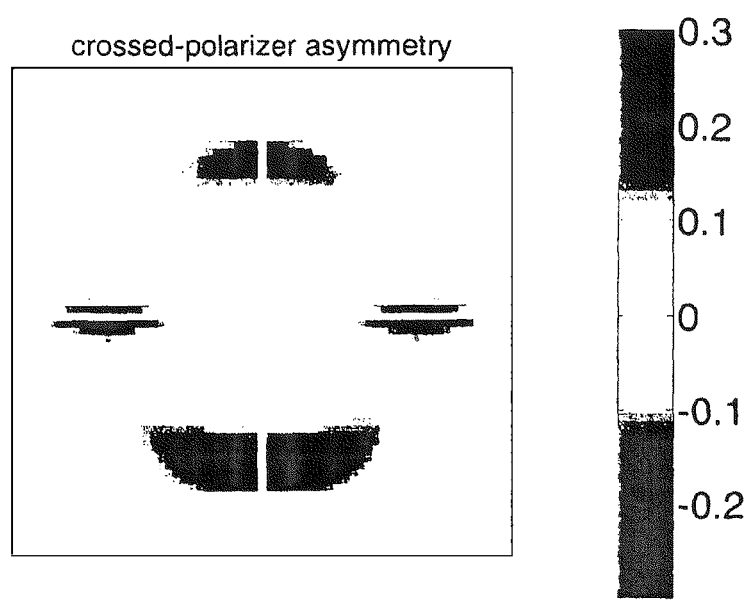
FIG. 5 shows the relative amount of crossed-polarizer asymmetry as measured from the spectra of FIG. 4.

In FIG. 5, an embodiment is shown in which the calculated relative amount of asymmetry as measured on the above stack 15 for about a 5 nm overlay error for the crossed-polarizer spectrum. The grayscale used indicates negative and positive values of the calculated asymmetry. The in-plane polarization may not have any information on asymmetry (and is not shown in the Figures), and it is therefore better to block this light for the overlay measurement. In this way, large asymmetry effects can be measured with only a few photons that are present in the crossed-polarizer spectrum.

In one example, the amount of light in the crossed polarizer spectrum may be very low, so this method uses a camera 7 with a sufficient dynamic range and a acceptable suppression of stray light. For example, a back-illuminated CCD with at minimum 12-bit resolution will provide reasonable results.

Moreover, the Wollaston prism which is used as crossed polarizer 6 should have an excellent extinction ratio.

The "in-plane" polarized light has no overlay information and therefore may introduce measurement errors. Additionally, or alternatively, spatially separating or blocking this light with a crossed-polarizer 6 can be performed without increasing sensor complexity.

Simulations indicate that UV wavelengths give sufficient asymmetry effects to allow the use of the present overlay measurement apparatus 10.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An overlay measurement apparatus comprising:
a polarized light source configured to illuminate a substrate with a polarized light beam;
an optical system configured to capture light reflected by the substrate from the polarized light beam, the optical system comprising:
a first non-polarizing beam splitter configured to receive the polarized light beam from the polarized light source, direct the polarized light beam to the substrate via a projection system, and receive a reflected light beam from the substrate via the projection system, the reflected beam comprising a zeroth order diffraction component;
a second non-polarizing beam splitter configured to receive the reflected light beam from the first non-polarizing beam splitter;
a crossed polarizer configured to receive a portion of reflected light beam from the second non-polarizing beam splitter and transmit an in-plane image and crossed-polarized image;
a blocking element configured to block the in-plane image;
a detector configured to measure an intensity of crossed-polarized image and produce a signal therefrom; and
a processing unit configured to receive the signal from the detector and to process crossed-polarized image for overlay metrology measurement using asymmetry data derived from crossed-polarized image.

2. The overlay measurement apparatus of claim 1, wherein the crossed polarizer comprises a Wollaston prism.

3. The overlay measurement apparatus of claim 1, wherein:
the substrate comprises a grating; and
the zeroth order diffraction component originates from conical diffraction of the polarized light beam from the grating.

4. The overlay measurement apparatus of claim 1, wherein the detector comprises a camera.

5. The overlay measurement apparatus of claim 1, Wherein the detector comprises a CCD camera.

6. The overlay measurement apparatus of claim 5, wherein the CCD camera has a minimum resolution of 12 bits.

7. The overlay measurement apparatus of claim 5, wherein the CCD camera comprises a back-illuminated CCD device.

8. A lithographic apparatus, comprising:
an illumination system configured to produce a beam of radiation;
a support configured to support a patterning device that is configured to pattern the beam of radiation;
a projection system configured to project the patterned beam onto a substrate; and
an overlay measurement system comprising:
a polarized light source configured to illuminate the substrate with a polarized light beam;
an optical system configured to capture light reflected by the substrate from the polarized light beam, the optical system comprising:
a first non-polarizing beam splitter configured to receive the polarized light beam from the polarized source, direct the polarized light beam to the substrate via the protection system, and receive a reflected light beam from the substrate via the projection system, the reflected light beam comprising a zeroth order diffraction component;
a second non-polarizing beam splitter configured to receive the reflected light beam from the first non-polarizing beam splitter;
a crossed polarizer configured to receive the a portion of reflected light beam from the second non-polarizing beam splitter and transmit an in-plane image and crossed-polarized image;
a blocking element configured to block the in-plane image;
a detector configured to measure the intensity of crossed-polarized image and produce a signal therefrom; and
a processing unit configured to receive the signal from the detector and to process crossed-polarized image for overlay metrology measurement using asymmetry data derived from crossed-polarized image.

9. The overlay measurement apparatus of claim 8, wherein the crossed polarizer comprises a Wollaston prism.

10. The overlay measurement apparatus of claim 8, wherein:
the substrate comprises a grating; and
the zeroth order diffraction component originates from conical diffraction of the polarized light beam from the grating.

11. A method of measuring overlay comprising:
illuminating a sample with a polarized light beam;
capturing light scattered by the sample from the polarized light beam;
transmitting an orthogonal polarization component that is orthogonal to a polarization direction of the polarized light beam;
splitting the captured light into an in-plane image and crossed-polarized image;
blocking the in-plane image;
measuring an intensity of the crossed-polarized image; and
performing an overlay metrology measurement using asymmetry data derived from the crossed-polarized image.

12. The method of claim 11, further comprising:
wherein the sample is a substrate;
wherein capturing of the light which is scattered by the sample comprises capturing a zeroth order diffraction component.

13. The method of claim 12, further comprising generating the zeroth order diffraction component from conical diffraction of the polarized light beam from a grating on the substrate.

14. The method of claim 11, wherein the measuring the intensity of the crossed-polarized image comprises measuring with a CCD camera.

15. The method of claim 14, wherein the CCD camera has a minimum resolution of 12 bits.

16. The method of claim 11, wherein the measuring the intensity of the cross-polarized image comprises measuring with a back-illuminated CCD device.

* * * * *

UNITED STATES PATENT AND TRADEMARK OFFICE
CERTIFICATE OF CORRECTION

PATENT NO.          : 8,823,922 B2                                   Page 1 of 1
APPLICATION NO.     : 13/000229
DATED               : September 2, 2014
INVENTOR(S)         : Arie Jeffrey Den Boef It is certified that error appears in the above-identified patent and that said Letters Patent is hereby corrected as shown below:

In the Claims

Column 9, line 18, claim 1, after "reflected", insert --light--.

Column 10, line 2, claim 8, after "via the", delete "protection" and insert --projection--.

Column 10, line 61, claim 16, after "of the", delete "cross-polarized" and insert --crossed-polarized--.

Signed and Sealed this
Seventeenth Day of February, 2015

Michelle K. Lee
*Deputy Director of the United States Patent and Trademark Office*